(12) United States Patent
Kotani et al.

(10) Patent No.: US 8,344,426 B2
(45) Date of Patent: Jan. 1, 2013

(54) SEMICONDUCTOR DEVICE AND DESIGN METHOD THEREOF

(75) Inventors: Naoki Kotani, Toyama (JP); Tokuhiko Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 237 days.

(21) Appl. No.: 12/976,153

(22) Filed: Dec. 22, 2010

(65) Prior Publication Data

US 2011/0156150 A1  Jun. 30, 2011

(30) Foreign Application Priority Data

Dec. 25, 2009  (JP) .................................. 2009-295703

(51) Int. Cl.
*H01L 27/10* (2006.01)
*H01L 21/335* (2006.01)

(52) U.S. Cl. . 257/206; 257/213; 257/401; 257/E27.001; 257/E27.013; 257/E27.059; 438/142; 438/279

(58) Field of Classification Search .......... 257/206–208, 257/213, 401, E27.001, E27.013, E27.059; 438/142, 128, 279, 275, 277, 280
See application file for complete search history.

(56) References Cited

U.S. PATENT DOCUMENTS

| 5,994,726 | A | 11/1999 | Ikeda et al. |
| 6,037,617 | A | 3/2000 | Kumagai |
| 8,013,395 | B2 * | 9/2011 | Kotani ........................ 257/368 |
| 2003/0080365 | A1 | 5/2003 | Sakamoto et al. |
| 2004/0173821 | A1 | 9/2004 | Sakamoto et al. |
| 2009/0026546 | A1 | 1/2009 | Shimada et al. |

FOREIGN PATENT DOCUMENTS

| JP | 2001-068653 | 3/2001 |
| JP | 3526450 | 2/2004 |
| JP | 2009-032961 | 2/2009 |

* cited by examiner

*Primary Examiner* — Hsien Ming Lee
(74) *Attorney, Agent, or Firm* — McDermott Will & Emery LLP

(57) ABSTRACT

A semiconductor device includes a plurality of first cells having a first cell height, and a plurality of second cells having a second cell height. Each of the first cells has a first MIS transistor of a first conductivity type, and a substrate contact region of a second conductivity type. Each of the second cells has a second MIS transistor of the first conductivity type, a power supply region of the first conductivity type, and a first extended region of the first conductivity type that is silicidated at a surface thereof. The first cell height is greater than the second cell height.

8 Claims, 3 Drawing Sheets

SEMICONDUCTOR DEVICE AND DESIGN METHOD THEREOF

CROSS-REFERENCE TO RELATED APPLICATION

This application claims priority to Japanese Patent Application No. 2009-295703 filed on Dec. 25, 2009, the disclosure of which including the specification, the drawings, and the claims is hereby incorporated by reference in its entirety.

BACKGROUND

The technique disclosed in the present invention relates to semiconductor devices and design methods thereof.

In recent years, miniaturization has rapidly progressed in the field of semiconductor devices. However, reducing the cell height of standard cells, etc. reduces flexibility of interconnect design. Thus, a technique has been proposed which increases the flexibility of interconnect design by connecting a power supply region to active regions of transistors by using silicide interconnects (see, e.g., Japanese Patent Publication No. 2001-68653).

FIG. 3 shows a conventional semiconductor device 120 having a structure that connects power supply regions to active regions of transistors by using silicide interconnects.

As shown in FIG. 3, a P-type impurity diffusion region 113 is divided into three regions, namely a source region S and two drain regions D, by gate electrodes 111, 112, and forms a P-type transistor group 121. The P-type impurity diffusion region 113 is electrically connected to a power supply interconnect 123 provided in a power supply interconnect region 117, via a contact portion 125 provided in a silicidated extended portion 113a in the P-type impurity diffusion region 113. Similarly, an N-type impurity diffusion region 116 is divided into three regions, namely a source region S and two drain regions D, by gate electrodes 114, 115, and forms an N-type transistor group 122. The N-type impurity diffusion region 116 is electrically connected to a power supply interconnect 124 provided in a power supply interconnect region 118, via a contact portion 126 provided in a silicidated extended portion 116a in the N-type impurity diffusion region 116. Note that reference characters 127, 128 represent interconnects. Thus, the conventional semiconductor device uses the silicidated extended portions 113a, 116a as silicide interconnects to increase interconnect efficiency and flexibility of interconnect design.

SUMMARY

However, when designing semiconductor devices by using silicide interconnects as in the conventional semiconductor device, the semiconductor devices have merely been designed by simply applying silicide interconnects to conventional cell structures, and the parasitic resistance due to silicide resistance, and the arrangement of gate electrodes in the regions using the silicide interconnects have not been sufficiently considered.

That is, when designing high speed circuits that require high current capability by using silicide interconnects in miniaturized logic cells, increasing the cell height increases the influence of the parasitic resistance of the silicide interconnects, thereby increasing cell delay. Thus, the number of cells needs to be increased in order to meet desired characteristics. This increases the chip area, which is against the current trend toward miniaturization.

In view of the above problem, it is an object of the present invention to provide a semiconductor device having a structure that contributes to reduction of the chip area while reducing cell delay, and a design method thereof.

In order to achieve the above object, an example semiconductor device and a design method thereof according to the present invention will be described below.

A semiconductor device according to one aspect of the present invention includes a plurality of first cells having a first cell height, and a plurality of second cells having a second cell height. The first cells and the second cells are formed on the same semiconductor substrate. Each of the first cells has: a first element isolation region formed so as to define a first element formation region in the semiconductor substrate; a first MIS transistor of a first conductivity type including, over the semiconductor substrate, a first gate electrode that is formed so as to extend across the first element formation region in a direction of the first cell height, and a first source region and a first drain region of the first conductivity type that are formed in regions extending laterally below the first gate electrode in the first element formation region; and a substrate contact region of a second conductivity type formed in the direction of the first cell height so as to face the first element formation region with the first element isolation region interposed therebetween. The second conductivity type is opposite in polarity to the first conductivity type. Each of the second cells has: a second element isolation region formed so as to define a second element formation region in the semiconductor substrate; a second MIS transistor of the first conductivity type including, over the semiconductor substrate, a second gate electrode that is formed so as to extend across the second element formation region in a direction of the second cell height, and a second source region and a second drain region of the first conductivity type that are formed in regions extending laterally below the second gate electrode in the second element formation region; a power supply region of the first conductivity type formed in the direction of the second cell height so as to face the second element formation region with the second element isolation region interposed therebetween; and a first extended region of the first conductivity type silicidated at a surface thereof, and provided between the power supply region of the first conductivity type and the second source region and interposed between portions of the second element isolation region, so as to connect the power supply region of the first conductivity type to the second source region. The first cell height is greater than the second cell height.

In the semiconductor device according to one aspect of the present invention, a contact plug may be formed over the first source region, but may not be formed over the second source region.

In the semiconductor device according to one aspect of the present invention, a length of a protruding portion of the second gate electrode in a gate width direction of the second gate electrode may be greater than that of a protruding portion of the first gate electrode in a gate width direction of the first gate electrode. The protruding portion of the second gate electrode may be a portion that protrudes beyond the second element formation region to a position on the second element isolation region, and the protruding portion of the first gate electrode may be a portion that protrudes beyond the first element formation region to a position on the first element isolation region.

In the semiconductor device according to one aspect of the present invention, each of the first cells may further have: a third element isolation region formed so as to define a third element formation region in the semiconductor substrate; a third MIS transistor of the second conductivity type including, over the semiconductor substrate, a third gate electrode that is continuous with the first gate electrode and is formed so as to extend across the third element formation region in the direction of the first cell height, and a third source region and a third drain region of the second conductivity type that are formed in regions extending laterally below the third gate electrode in the third element formation region; and a substrate contact region of the first conductivity type formed in the direction of the first cell height so as to face the third element formation region with the third element isolation region interposed therebetween. Each of the second cells may further have: a fourth element isolation region formed so as to define a fourth element formation region in the semiconductor substrate; a fourth MIS transistor of the second conductivity type including, over the semiconductor substrate, a fourth gate electrode that is continuous with the second gate electrode and is formed so as to extend across the fourth element formation region in the direction of the second cell height, and a fourth source region and a fourth drain region of the second conductivity type that are formed in regions extending laterally below the fourth gate electrode in the fourth element formation region; a power supply region of the second conductivity type formed in the direction of the second cell height so as to face the fourth element formation region with the fourth element isolation region interposed therebetween; and a second extended region of the second conductivity type silicidated at a surface thereof, and provided between the power supply region of the second conductivity type and the fourth source region and interposed between portions of the fourth element isolation region, so as to connect the power supply region of the second conductivity type to the fourth source region.

In this case, a contact plug may be formed over the third source region, but may not be formed over the fourth source region.

In this case, a length of a protruding portion of the fourth gate electrode in a gate width direction of the fourth gate electrode may be greater than that of a protruding portion of the third gate electrode in a gate width direction of the third gate electrode. The protruding portion of the fourth gate electrode may be a portion that protrudes beyond the fourth element formation region to a position on the fourth element isolation region, and the protruding portion of the third gate electrode may be a portion that protrudes beyond the third element formation region to a position on the third element isolation region.

In this case, a first gate contact formation region may be formed in a region where the first gate electrode is continuous with the third gate electrode, a second gate contact formation region may be formed in a region where the second gate electrode is continuous with the fourth gate electrode, and a length of the first gate contact formation region in the direction of the first cell height may be greater than that of the second gate contact formation region in the direction of the second cell height.

A method for designing a semiconductor device according to one aspect of the present invention is a method for designing the semiconductor device of the above one aspect of the present invention. The method includes the step of: designing the semiconductor device by using the first cells when a ratio of a cell height to an interconnect pitch is higher than 8, and designing the semiconductor device by using the second cells when the ratio is 8 or less.

According to one aspect of the present invention, a semiconductor device having a structure capable of reducing the chip area while reducing the influence of parasitic capacitance of silicide interconnects to an acceptable range, and a design method thereof can be implemented.

DETAILED DESCRIPTION

The technical idea of the present invention will be explained below based on the accompanying drawings and detailed description of the invention. It will be apparent to those skilled in the art that various modifications and additions can be made to preferred embodiments of the present invention by using the technique disclosed in the present invention, without departing from the technical idea and scope of the present invention.

A semiconductor device and a design method thereof according to an example embodiment of the present invention will be described below with reference to the accompanying drawings.

Figure 1:
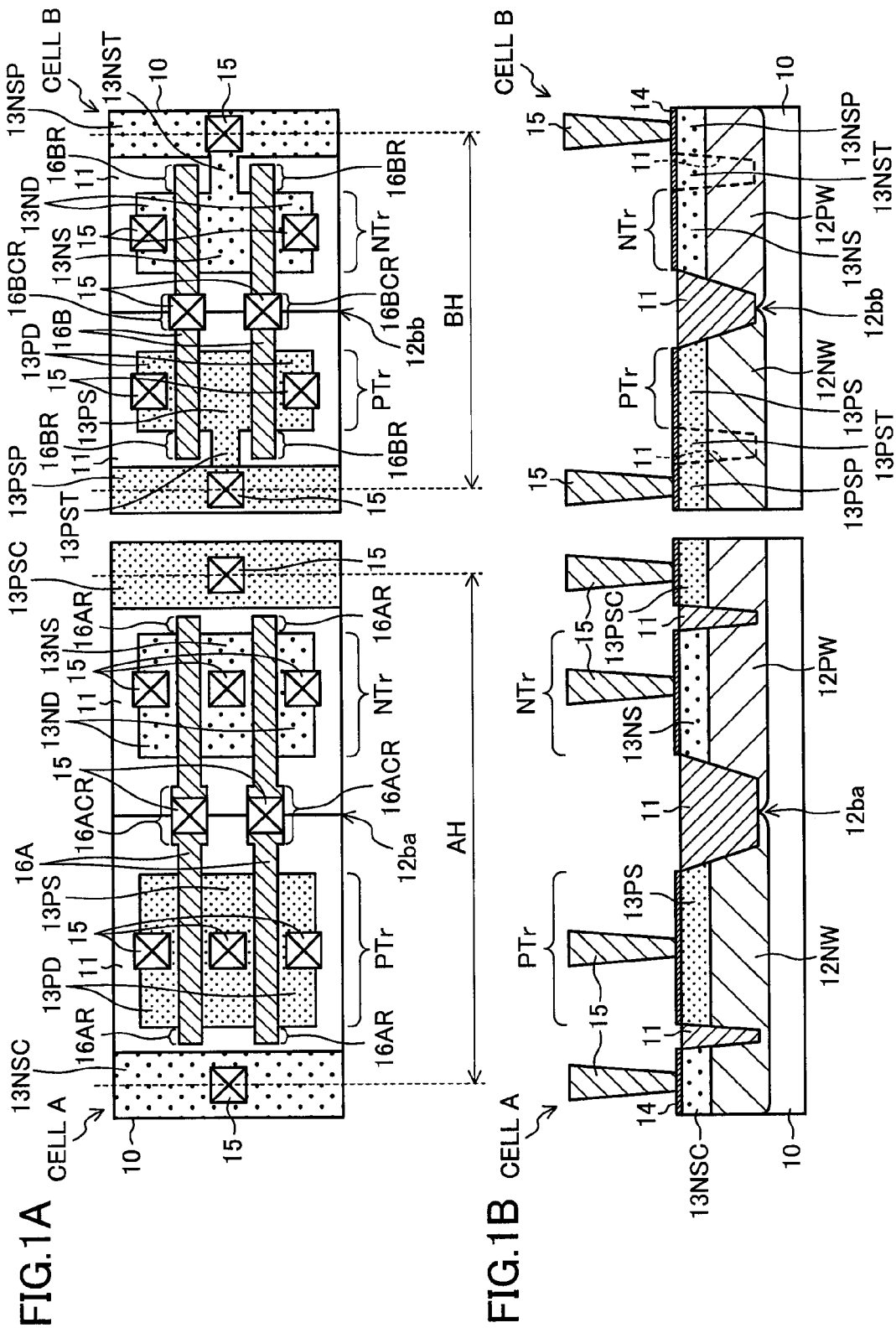
FIG. 1A is a plan view showing the structure of a semiconductor device including cells A, B according to an example embodiment of the present invention.
FIG. 1B is a cross-sectional view showing the structure of the semiconductor device including the cells A, B according to the example embodiment of the present invention.

FIG. 1A is a plan view showing the structure of a semiconductor device having cells A, B according to an example embodiment of the present invention, and FIG. 1B is a cross-sectional view showing the structure of the semiconductor device having the cells A, B according to the example embodiment of the present invention. Specifically, FIG. 1B shows cross sections of the cells A, B of FIG. 1A taken along the centerline of the cell width in a cell height (AH, BH) direction.

As shown in FIGS. 1A-1B, the semiconductor device of the present embodiment includes the cell A (a first cell) and the cell B (a second cell) that are formed on the same semiconductor substrate 10. The cell A has a cell height AH (a first cell height) of 1,400 nm, an interconnect pitch of 140 nm, and a cell height/interconnect pitch ratio (the ratio of the cell height to the interconnect pitch) of 10. The cell B has a cell height BH (a second cell height) of 980 nm, an interconnect pitch of 140 nm, and a cell height/interconnect pitch ratio (the ratio of the cell height to the interconnect pitch) of 7.

A P-type transistor PTr (a first metal insulator semiconductor (MIS) transistor) and an N-type transistor NTr (a third MIS transistor) are formed in element formation regions (first and third element formation regions) that are defined by an element isolation region 11 (first and third element isolation regions) of the semiconductor substrate 10 in the cell A. A P-type transistor PTr (a second MIS transistor) and an N-type transistor NTr (a fourth MIS transistor) are formed in element formation regions (second and fourth element formation regions) that are defined by the element isolation region 11 (second and fourth element isolation regions) of the semiconductor substrate 10 in the cell B. This will be described in detail below.

In the structure of the cell A, an N-type well 12NW is formed in a region located on one side of the centerline of the element isolation region 11 in the semiconductor substrate 10, and a P-type well 12PW is formed in a region located on the other side thereof. The N-type well 12NW and the P-type well 12PW are positioned so that the N-type well 12NW adjoins the P-type well 12PW in the cell height direction (the gate width direction) at a well boundary 12*ba* immediately below the element isolation region 11.

The N-type well 12NW is divided into three regions by a pair of gate electrodes 16A (first and third gate electrodes, see FIG. 1A) described later. That is, as shown in FIGS. 1A-1B, the N-type well 12NW is divided into a P-type source region 13PS and two P-type drain regions 13PD. The P-type source region 13PS and the P-type drain regions 13PD are formed in the regions extending laterally below the gate electrodes 16A in the element formation region (the first element formation region). The P-type source region 13PS has a contact plug 15 that is connected to a silicide layer 14 formed at the surface, and each of the P-type drain regions 13PD has a contact plug 15 that is connected to the silicide layer 14 formed at the surface. In the N-type well 12NW, an N-type substrate contact region 13NSC is formed in a region that faces the P-type source region 13PS and the P-type drain regions 13PD with the element isolation region 11 interposed therebetween. The N-type substrate contact region 13NSC has a length of about 120 nm in the cell height (AH) direction, and has a contact plug 15 that is connected to the silicide layer 14 formed at the surface. The N-type substrate contact region 13NSC is provided on the opposite side of the element formation region (the first element formation region) from the well boundary 12*ba* in the cell height direction (the gate width direction) with the element isolation region 11 interposed therebetween. The polarity of the N-type substrate contact region 13NSC is opposite to that of the P-type source region 13PS and the P-type drain regions 13PD. Thus, different potentials can be applied to the contact plug 15 formed over the P-type source region 13PS and the contact plug 15 formed over the N-type substrate contact region 13NSC.

Similarly, the P-type well 12PW is divided into three regions by the pair of gate electrodes 16A (see FIG. 1A) described later. That is, as shown in FIGS. 1A-1B, the P-type well 12PW is divided into an N-type source region 13NS and two N-type drain regions 13ND. The N-type source region 13NS and the N-type drain regions 13ND are formed in the regions extending laterally below the gate electrodes 16A in the element formation region (the third element formation region). The N-type source region 13NS has a contact plug 15 that is connected to the silicide layer 14 formed at the surface, and each of the N-type drain regions 13ND has a contact plug 15 that is connected to the silicide layer 14 formed at the surface. In the P-type well 12PW, a P-type substrate contact region 13PSC is formed in a region that faces the N-type source region 13NS and the N-type drain regions 13ND with the element isolation region 11 interposed therebetween. The P-type substrate contact region 13PSC has a length of about 120 nm in the cell height (AH) direction, and has a contact plug 15 that is connected to the silicide layer 14 formed at the surface. The P-type substrate contact region 13PSC is provided on the opposite side of the element formation region (the third element formation region) from the well boundary 12*ba* in the cell height direction (the gate width direction) with the element isolation region 11 interposed therebetween. The polarity of the P-type substrate contact region 13PSC is opposite to that of the N-type source region 13NS and the N-type drain regions 13ND. Thus, different potentials can be applied to the contact plug 15 formed over the N-type source region 13NS and the contact plug 15 formed over the P-type substrate contact region 13PSC.

As shown in FIG. 1A, the pair of gate electrodes 16A having a gate length of about 40 nm and having the silicide layer (not shown) at the surface are formed over the semiconductor substrate 10 so as to extend across the element isolation region 11 interposed between the element formation region of the P-type transistor PTr and the element formation region of the N-type transistor NTr, the element formation region of the P-type transistor PTr, and the element formation region of the N-type transistor NTr in the cell height (AH) direction. Each of the pair of gate electrodes 16A has a gate contact formation region 16ACR (a first gate contact formation region) near the well boundary 12*ba* that is a boundary between the N-type well 12NW and the P-type well 12PW. The gate contact formation regions 16ACR have a length of about 60 nm in the gate length direction, and a length of about 100 nm in the gate width direction (the cell height (AH) direction). A contact plug 15 is formed over each of the gate contact formation regions 16ACR. Each of the pair of gate electrodes 16A has gate protruding regions 16AR at both ends in the gate width direction, and the gate protruding regions 16AR have a length of about 70 nm in the gate width direction (the cell height (AH) direction).

In the structure of the cell B, an N-type well 12NW is formed in a region located on one side of the centerline of the element isolation region 11 in the semiconductor substrate 10, and a P-type well 12PW is formed in a region located on the other side thereof. The N-type well 12NW and the P-type well 12PW are positioned so that the N-type well 12NW adjoins the P-type well 12PW in the cell height direction (the gate width direction) at a well boundary 12*bb* immediately below the element isolation region 11.

The N-type well 12NW is divided into three regions by a pair of gate electrodes 16B (second and fourth gate electrodes, see FIG. 1A) described later. That is, as shown in FIGS. 1A-1B, the N-type well 12NW is divided into a P-type source region 13PS and two P-type drain regions 13PD. The P-type source region 13PS and the P-type drain regions 13PD are formed in the regions extending laterally below the gate electrodes 16B in the element formation region (the second element formation region). The P-type source region 13PS has the silicide layer 14 formed at the surface, and each of the P-type drain regions 13PD has a contact plug 15 that is connected to the silicide layer 14 formed at the surface. The P-type source region 13PS in the N-type well 12NW includes a P-type extended region 13PST (a silicide interconnect), which is continuous with the P-type source region 13PS and is interposed between portions of the element isolation region 11. The P-type extended region 13PST has the silicide layer 14 at the surface, and has a length of 225 nm in the cell height (BH) direction. The P-type extended region 13PST is connected to a P-type power supply region 13PSP having a length of 90 nm in the cell height (BH) direction. The P-type power supply region 13PSP is continuous with the P-type extended region 13PST, and is formed so as to face the P-type source region 13PS (except a potion that is continuous with the P-type extended region 13PST) and the P-type drain regions 13PD with the element isolation region 11 interposed therebetween. The P-type power supply region 13PSP is provided on the opposite side of the element formation region (the second element formation region) from the well boundary 12*bb* in the cell height direction (the gate width direction) with the element isolation region 11 interposed therebetween except a portion connected to the P-type extended region 13PST. The P-type power supply region 13PSP has a contact plug 15 that is connected to the silicide layer 14 formed at the surface, but no contact plug 15 is formed over the P-type source region 13PS. The polarity of the P-type power supply region 13PSP is the same as that of the P-type source region 13PS, the P-type drain regions 13PD, and the P-type extended region 13PST. Thus, the P-type source region 13PS and the P-type power supply region 13PSP have the same potential via the P-type extended region 13PST having the silicide layer 14 at the surface.

Similarly, the P-type well 12PW is divided into three regions by the pair of gate electrodes 16B (see FIG. 1A) described later. That is, as shown in FIGS. 1A-1B, the P-type well 12PW is divided into an N-type source region 13NS and two N-type drain regions 13ND. The N-type source region 13NS and the N-type drain regions 13ND are formed in the regions extending laterally below the gate electrodes 16B in the element formation region (the fourth element formation region). The N-type source region 13NS has the silicide layer 14 formed at the surface, and each of the N-type drain regions 13ND has a contact plug 15 that is connected to the silicide layer 14 formed at the surface. The N-type source region 13NS in the P-type well 12PW includes an N-type extended region 13NST (a silicide interconnect), which is continuous with the N-type source region 13NS and is interposed between portions of the element isolation region 11. The N-type extended region 13NST has the silicide layer 14 at the surface, and has a length of 225 nm in the cell height (BH) direction. The N-type extended region 13NST is connected to an N-type power supply region 13NSP having a length of 90 nm in the cell height (BH) direction. The N-type power supply region 13NSP is continuous with the N-type extended region 13NST, and is formed so as to face the N-type source region 13NS (except a potion that is continuous with the N-type extended region 13NST) and the N-type drain regions 13ND with the element isolation region 11 interposed therebetween. The N-type power supply region 13NSP has a contact plug 15 that is connected to the silicide layer 14 formed at the surface, but no contact plug 15 is formed over the N-type source region 13NS. The N-type power supply region 13NSP is provided on the opposite side of the element formation region (the fourth element formation region) from the well boundary 12bb in the cell height direction (the gate width direction) with the element isolation region 11 interposed therebetween except a portion connected to the N-type extended region 13NST. The polarity of the N-type power supply region 13NSP is the same as that of the N-type source region 13NS, the N-type drain regions 13ND, and the N-type extended region 13NST. Thus, the N-type source region 13NS and the N-type power supply region 13NSP have the same potential via the N-type extended region 13NST having the silicide layer 14 at the surface.

As shown in FIG. 1A, the pair of gate electrodes 16B having a gate length of about 40 nm and having the silicide layer (not shown) at the surface are formed over the semiconductor substrate 10 so as to extend across the element isolation region 11 interposed between the element formation region of the P-type transistor PTr and the element formation region of the N-type transistor NTr, the element formation region of the P-type transistor PTr, and the element formation region of the N-type transistor NTr in the cell height (BH) direction. Each of the pair of gate electrodes 16B has a gate contact formation region 16BCR (a second gate contact formation region) near the well boundary 12bb that is a boundary between the N-type well 12NW and the P-type well 12PW. The gate contact formation regions 16BCR have a length of about 60 nm in the gate length direction, and a length of about 60 nm in the gate width direction (the cell height (BH) direction). A contact plug 15 is formed over each of the gate contact formation regions 16BCR. Each of the pair of gate electrodes 16B has gate protruding regions 16BR at both ends in the gate width direction, and the gate protruding regions 16BR have a length of about 100 nm in the gate width direction (the cell height (BH) direction).

Figure 2:
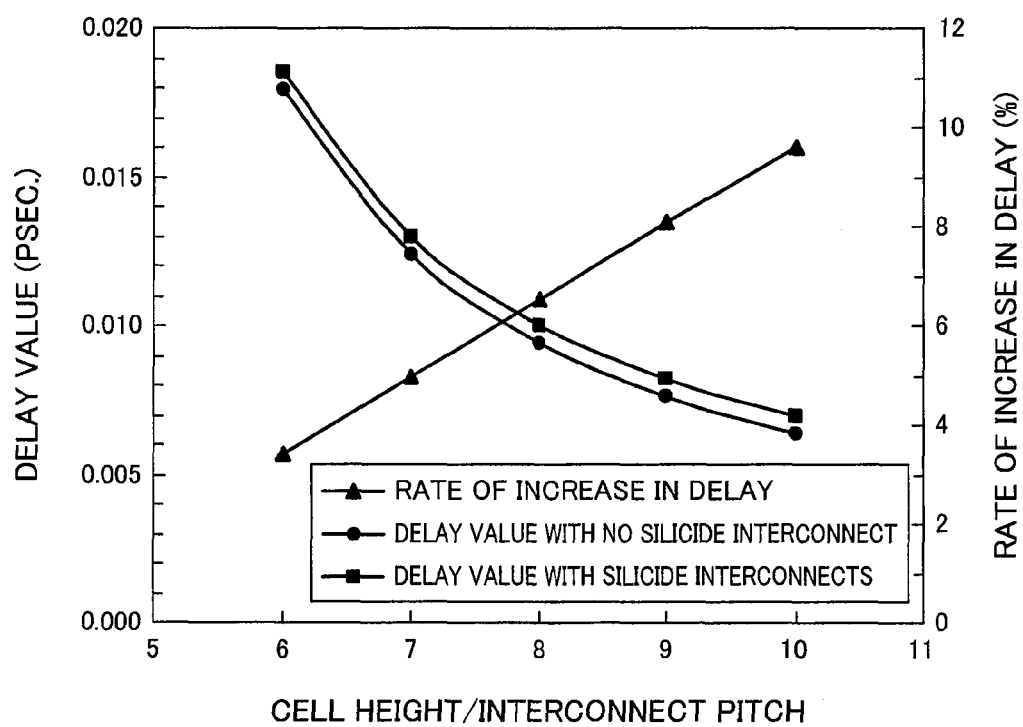
FIG. 2 is a graph showing the relation among the cell delay value (psec), the cell height/interconnect pitch ratio, and the rate of increase in delay (%) in the example embodiment of the present invention.
Figure 3:
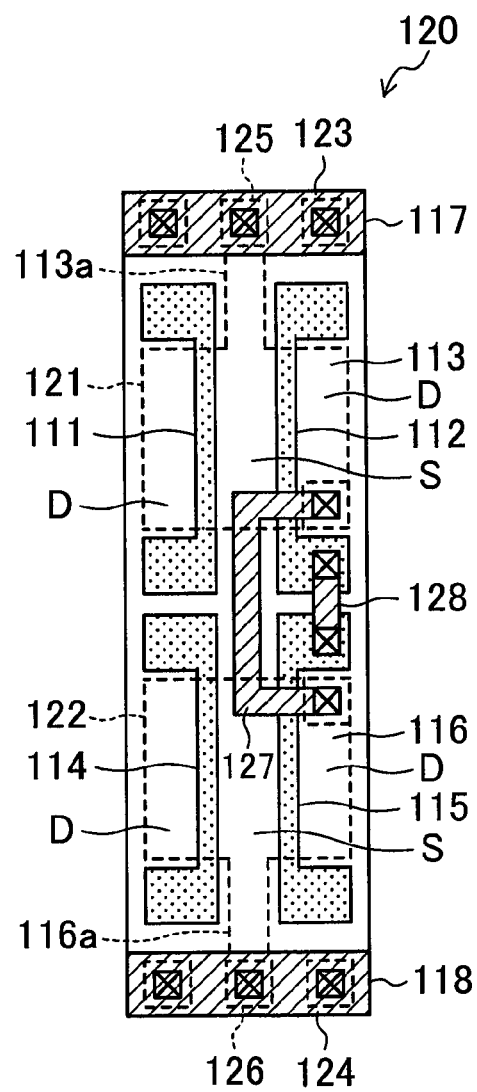
FIG. 3 is a plan view showing the structure of a conventional semiconductor device.

FIG. 2 shows the relation among the cell delay value (psec), the cell height/interconnect pitch ratio (the ratio of the cell height to the interconnect pitch), and the rate of increase in delay (%) in the example embodiment of the present invention. Note that the rate of increase in delay (▲) means the ratio of the delay value (■) of cells having silicide interconnects to the delay value (●) of cells having no silicide interconnect.

As shown in FIG. 2, as the cell height/interconnect pitch ratio increases, the delay value decreases regardless of whether the cells have silicide interconnects or not. However, the difference between the delay value of the cells having silicide interconnects and the delay value of the cells having no silicide interconnect slightly increases as the cell height/interconnect pitch ratio increases. Thus, the rate of increase in delay increases linearly as the cell height/interconnect pitch ratio increases.

In the cells having silicide interconnects, it is preferable that an increase in delay due to the parasitic resistance of the silicide interconnects be within the range of about 6% or less as the rate of increase in delay. Thus, as can be seen from FIG. 2, if the cell height/interconnect pitch ratio is higher than 8, the use of the cells having silicide interconnects results in a high rate of increase in delay. Namely, the parasitic resistance of the silicide interconnects significantly affects an increase in delay. Thus, it is not preferable to use the cells having silicide interconnects. On the other hand, if the cell height/interconnect pitch ratio is 8 or less, the use of the cells having silicide interconnects does not result in a high ratio of increase in delay. That is, the parasitic resistance of the silicide interconnects does not significantly affect an increase in delay. Thus, it is preferable to use the cells having silicide interconnects.

In the semiconductor device of the present embodiment, a plurality of cells A and a plurality of cells B are placed on the same semiconductor substrate. The cells A have a high cell height AH and have no silicide interconnect, whereas the cells B have a cell height BH lower than the cell height AH of the cells A and has silicide interconnects. Thus, in the semiconductor device of the present embodiment, it is preferable to use the cells having a high cell height and having no silicide interconnect, in a region having a high cell height/interconnect pitch ratio in a circuit region where high current capability is required and thus the cell height should be high. Specifically, in the case where the cell height/interconnect pitch ratio is higher than 8, it is preferable to use the cells A having the cell height AH and having no silicide interconnect. On the other hand, it is preferable to use the cells having a low cell height and having silicide interconnects, in a region having a low cell height/interconnect pitch ratio in a circuit region where high current capability is not required and thus the cell height need not be high. Specifically, in the case where the cell height/interconnect pitch ratio is 8 or less, it is preferable to use the cells B having the cell height BH lower than the cell height AH, and having silicide interconnects.

Since the cells A are used in the circuit region where high speed operations are required, and the cells B are used in the circuit region where no high speed operation is required, the chip area can be reduced while reducing the influence of the parasitic resistance of the silicide interconnects to an acceptable range.

As described above, the gate protruding regions 16BR of the gate electrodes 16B in the cell B, which are the portions protruding beyond the P-type drain regions 13PD and the P-type source region 13PS or beyond the N-type drain regions 13ND and the N-type source region 13NS, have a length of about 100 nm in the gate width direction. On the other hand, the gate protruding regions 16AR of the gate electrodes 16A in the cell A, which are the portions protruding beyond the P-type drain regions 13PD and the P-type source region 13PS or beyond the N-type drain regions 13ND and the N-type source region 13NS, have a length of about 70 nm in the gate width direction. Thus, the gate protruding regions 16BR in the cell B are longer than the gate protruding regions 16AR in the cell A in the gate width direction. This reduces the possibility that the tip ends of the gate electrodes 16BR may be located in a rounding region (not shown) that is formed in the P-type extended region 13PST or the N-type extended region 13NST interposed between the gate protruding regions 16BR in the cell B. Thus, current leakage due to punchthrough between the source and the drain can be reduced.

As described above, the area of the gate contact formation region 16ACR in each gate electrode 16A in the cell A has, e.g., a width of about 60 nm in the gate length direction, and a length of about 100 nm in the gate width direction, whereas the area of the gate contact formation region 16BCR in each gate electrode 16B in the cell B has, e.g., a width of about 60 nm in the gate length direction, and a length of about 60 nm in the gate width direction. The area of the gate contact formation regions 16ACR in the cell A is thus greater than that of the gate contact formation regions 16BCR in the cell B in the gate width direction for the following reasons. Due to the length dependency of disconnections in the silicide layer, the disconnections are more likely to be caused in the silicide layer as the length of the silicide layer increases. Moreover, the disconnections tend to be caused at P/N boundaries. In the cell A having a higher cell height AH than the cell height BH, the gate width of the gate electrodes 16A is larger than that of the gate electrodes 16B in the cell B. Thus, disconnections are more likely to be caused in the silicide layer located above the well boundary 12*ba* in the gate electrodes 16A, than in the silicide layer located above the well boundary 12*bb* in the gate electrodes 16B. Since the area of the gate contact regions 16ACR located above the well boundary 12*ba* in the gate electrodes 16A is made larger in the gate width direction than that of the gate contact regions 16BCR located above the well boundary 12*bb* in the gate electrodes 16B, the possibility that disconnections may be caused in the silicide layer located above the well boundary 12*ba* in the gate electrodes 16A can be more effectively reduced.

As described above, according to the semiconductor device of the present embodiment, the cells A, B that are different from each other in the cell height and in the presence/absence of the silicide interconnects are used in an optimal manner. Thus, the chip area can be reduced while reducing the influence of the parasitic resistance of the silicide interconnects to an acceptable range.

Since the gate protruding regions 16BR in the cell B are made longer than the gate protruding regions 16AR in the cell A, leakage current due to punchthrough between the source and the drain can be reduced.

Moreover, since the area of the gate contact regions 16ACR in the gate electrodes 16A is made larger than that of the gate contact regions 16BCR in the gate electrodes 16B, the possibility that disconnections may be caused in the silicide layer located above the well boundary 12*ba* in the gate electrodes 16A can be effectively reduced.

Note that the present invention is useful for semiconductor devices and design methods thereof.

What is claimed is:

1. A semiconductor device, comprising:
a plurality of first cells having a first cell height, and a plurality of second cells having a second cell height, wherein
the first cells and the second cells are formed on the same semiconductor substrate,
each of the first cells has
a first element isolation region formed so as to define a first element formation region in the semiconductor substrate,
a first MIS transistor of a first conductivity type including, over the semiconductor substrate, a first gate electrode that is formed so as to extend across the first element formation region in a direction of the first cell height, and a first source region and a first drain region of the first conductivity type that are formed in regions extending laterally below the first gate electrode in the first element formation region, and
a substrate contact region of a second conductivity type formed in the direction of the first cell height so as to face the first element formation region with the first element isolation region interposed therebetween,
the second conductivity type is opposite in polarity to the first conductivity type,
each of the second cells has
a second element isolation region formed so as to define a second element formation region in the semiconductor substrate,
a second MIS transistor of the first conductivity type including, over the semiconductor substrate, a second gate electrode that is formed so as to extend across the second element formation region in a direction of the second cell height, and a second source region and a second drain region of the first conductivity type that are formed in regions extending laterally below the second gate electrode in the second element formation region,
a power supply region of the first conductivity type formed in the direction of the second cell height so as to face the second element formation region with the second element isolation region interposed therebetween, and
a first extended region of the first conductivity type silicidated at a surface thereof, and provided between the power supply region of the first conductivity type and the second source region and interposed between portions of the second element isolation region, so as to connect the power supply region of the first conductivity type to the second source region, and
the first cell height is greater than the second cell height.

2. The semiconductor device of claim 1, wherein
a contact plug is formed over the first source region, but is not formed over the second source region.

3. The semiconductor device of claim 1, wherein
a length of a protruding portion of the second gate electrode in a gate width direction of the second gate electrode is greater than that of a protruding portion of the first gate electrode in a gate width direction of the first gate electrode, and
the protruding portion of the second gate electrode is a portion that protrudes beyond the second element formation region to a position on the second element isolation region, and the protruding portion of the first gate electrode is a portion that protrudes beyond the first element formation region to a position on the first element isolation region.

4. The semiconductor device of claim 1, wherein
each of the first cells further has
a third element isolation region formed so as to define a third element formation region in the semiconductor substrate,
a third MIS transistor of the second conductivity type including, over the semiconductor substrate, a third gate electrode that is continuous with the first gate electrode and is formed so as to extend across the third element formation region in the direction of the first cell height, and a third source region and a third drain region of the second conductivity type that are formed in regions extending laterally below the third gate electrode in the third element formation region, and
a substrate contact region of the first conductivity type formed in the direction of the first cell height so as to face the third element formation region with the third element isolation region interposed therebetween, and
each of the second cells further has
a fourth element isolation region formed so as to define a fourth element formation region in the semiconductor substrate,
a fourth MIS transistor of the second conductivity type including, over the semiconductor substrate, a fourth gate electrode that is continuous with the second gate electrode and is formed so as to extend across the fourth element formation region in the direction of the second cell height, and a fourth source region and a fourth drain region of the second conductivity type that are formed in regions extending laterally below the fourth gate electrode in the fourth element formation region,
a power supply region of the second conductivity type formed in the direction of the second cell height so as to face the fourth element formation region with the fourth element isolation region interposed therebetween, and
a second extended region of the second conductivity type silicidated at a surface thereof, and provided between the power supply region of the second conductivity type and the fourth source region and interposed between portions of the fourth element isolation region, so as to connect the power supply region of the second conductivity type to the fourth source region.

5. The semiconductor device of claim 4, wherein
a contact plug is formed over the third source region, but is not formed over the fourth source region.

6. The semiconductor device of claim 4, wherein
a length of a protruding portion of the fourth gate electrode in a gate width direction of the fourth gate electrode is greater than that of a protruding portion of the third gate electrode in a gate width direction of the third gate electrode, and
the protruding portion of the fourth gate electrode is a portion that protrudes beyond the fourth element formation region to a position on the fourth element isolation region, and the protruding portion of the third gate electrode is a portion that protrudes beyond the third element formation region to a position on the third element isolation region.

7. The semiconductor device of claim 4, wherein
a first gate contact formation region is formed in a region where the first gate electrode is continuous with the third gate electrode,
a second gate contact formation region is formed in a region where the second gate electrode is continuous with the fourth gate electrode, and
a length of the first gate contact formation region in the direction of the first cell height is greater than that of the second gate contact formation region in the direction of the second cell height.

8. A method for designing the semiconductor device of claim 1, comprising the step of:
designing the semiconductor device by using the first cells when a ratio of a cell height to an interconnect pitch is higher than 8, and designing the semiconductor device by using the second cells when the ratio is 8 or less.

* * * * *